United States Patent
Huesgen

(10) Patent No.: US 9,313,916 B2
(45) Date of Patent: Apr. 12, 2016

(54) COOLED ELECTRICAL ASSEMBLY

(71) Applicant: ABB Research Ltd, Zürich (CH)

(72) Inventor: Till Huesgen, Burgberg (DE)

(73) Assignee: ABB RESEARCH LTD, Zürich (CH)

( * ) Notice: Subject to any disclaimer, the term of this patent is extended or adjusted under 35 U.S.C. 154(b) by 246 days.

(21) Appl. No.: 14/052,320

(22) Filed: Oct. 11, 2013

(65) Prior Publication Data

US 2014/0104788 A1    Apr. 17, 2014

(30) Foreign Application Priority Data

Oct. 16, 2012    (EP) .................................... 12188606

(51) Int. Cl.
| H05K 7/20 | (2006.01) |
| F04D 33/00 | (2006.01) |
| H01G 2/08 | (2006.01) |
| H01L 23/467 | (2006.01) |
| H01G 9/00 | (2006.01) |
| H01G 4/38 | (2006.01) |

(52) U.S. Cl.
CPC ............ *H05K 7/20136* (2013.01); *F04D 33/00* (2013.01); *H01G 2/08* (2013.01); *H01G 9/0003* (2013.01); *H01L 23/467* (2013.01); *H05K 7/20172* (2013.01); *H01G 4/38* (2013.01); *H01L 2924/0002* (2013.01)

(58) Field of Classification Search
CPC .................................. F28F 13/10; H01G 2/08
See application file for complete search history.

(56) References Cited

U.S. PATENT DOCUMENTS

| 6,043,978 | A | * | 3/2000 | Mody et al. .................... 361/690 |
| 6,141,217 | A | | 10/2000 | Nakahama et al. |
| 7,031,155 | B2 | * | 4/2006 | Sauciuc et al. ................. 361/695 |
| 7,248,475 | B2 | * | 7/2007 | Paydar et al. .................. 361/695 |

(Continued)

FOREIGN PATENT DOCUMENTS

| CN | 101524010 A | 9/2009 |
| CN | 101978172 A | 2/2011 |

(Continued)

OTHER PUBLICATIONS

English translation of Saiko et al., Soviet Union (SU) 1273730 A1, translated Jan. 2014.*

(Continued)

*Primary Examiner* — Robert J Hoffberg
(74) *Attorney, Agent, or Firm* — Buchanan Ingersoll & Rooney PC

(57) ABSTRACT

A cooled electrical assembly is disclosed which includes a plurality of cooled components and a first cooling fan adapted to provide a cooling flow for cooling the cooled components, the first cooling fan including a blade holder and a fan blade, the fan blade having a fixed end stationary mounted to the blade holder and a free end adapted to swing for generating the cooling flow. The plurality of cooled components can include four substantially cylindrical components each having a centre axis, the four substantially cylindrical components being spaced apart and located such that the centre axis of each said substantially cylindrical component passes through a respective vertex of a quadrilateral, the free end of the fan blade being located between the four substantially cylindrical components and inside the quadrilateral.

14 Claims, 2 Drawing Sheets

(56) References Cited

U.S. PATENT DOCUMENTS

| | | | |
|---|---|---|---|
| 8,106,567 | B2 | 1/2012 | Eichhorner et al. |
| 8,120,907 | B2 * | 2/2012 | Chen et al. .................... 361/690 |
| 8,322,889 | B2 * | 12/2012 | Petroski ........................ 362/294 |
| 2002/0051340 | A1 | 5/2002 | Oda et al. |
| 2007/0025081 | A1 | 2/2007 | Berlin et al. |
| 2010/0038994 | A1 | 2/2010 | Eichhorner et al. |
| 2011/0014069 | A1 | 1/2011 | Wada et al. |

FOREIGN PATENT DOCUMENTS

| | | | |
|---|---|---|---|
| DE | 10 2004 045182 A1 | 4/2006 | |
| DE | 10 2010 032936 A1 | 5/2012 | |
| EP | 1 178 558 A2 | 2/2002 | |
| EP | 1 748 688 A2 | 1/2007 | |
| SU | 1273730 A1 * | 11/1986 | ................ F28F 3/02 |

OTHER PUBLICATIONS

International Search Report (PCT/ISA/210) mailed on Mar. 11, 2013, by the European Patent Office as the International Searching Authority for International Application No.

Office Action issued on Sep. 6, 2015, by the State Intellectual Property Office of People's Republic of China in corresponding Chinese Application No. 201310484534.1, and an English translation of the Office Action. (20 pages).

* cited by examiner

COOLED ELECTRICAL ASSEMBLY

RELATED APPLICATION(S)

This application claims priority under 35 U.S.C. §119 to European Patent Application No. 12188606.3 filed in Europe on Oct. 16, 2012, the entire content of which is hereby incorporated by reference in its entirety.

FIELD

The present disclosure relates to a cooled electrical assembly, such as an assembly having a plurality of cooled components and a first cooling fan adapted to provide a cooling flow for cooling the plurality of cooled components, the first cooling fan including a fan blade having a fixed end a free end adapted to swing back and forth.

BACKGROUND INFORMATION

It is known in the art to use a fan blade having a reciprocating free end for cooling a plurality of electrical components. For example, document EP 1748688 discloses an electronic package cooled by a piezo fan.

SUMMARY

A cooled electrical assembly is disclosed including a plurality of cooled components and a first cooling fan adapted to provide a cooling flow for cooling the cooled components, the first cooling fan including a blade holder and a fan blade, the fan blade having a fixed end stationary mounted to the blade holder and a free end adapted to swing for generating the cooling flow, wherein the plurality of cooled components comprises four substantially cylindrical components each having a centre axis, the four substantially cylindrical components being spaced apart and located such that the centre axis of each said substantially cylindrical component passes through a respective vertex of a quadrilateral, the free end of the fan blade being located between the four substantially cylindrical components and inside the quadrilateral.

BRIEF DESCRIPTION OF THE DRAWINGS

In the following, the disclosure will be described in greater detail by way of exemplary embodiments with reference to the attached drawings, in which.

DETAILED DESCRIPTION

An electrical assembly is disclosed with efficient and economic cooling system.

Exemplary embodiments are based on a realization that a flow pattern generated by a cooling fan which includes a fan blade having a free end adapted to swing back and forth is especially well suited for cooling four substantially cylindrical components, such as electrolytic capacitors, arranged in a form of a quadrilateral. In such a formation, the substantially cylindrical components contribute to shaping of the flow pattern thereby acting as flow-shaping structures. Therefore exemplary embodiments can provide an energy-efficient way of cooling a group of substantially cylindrical components.

Figure 1:
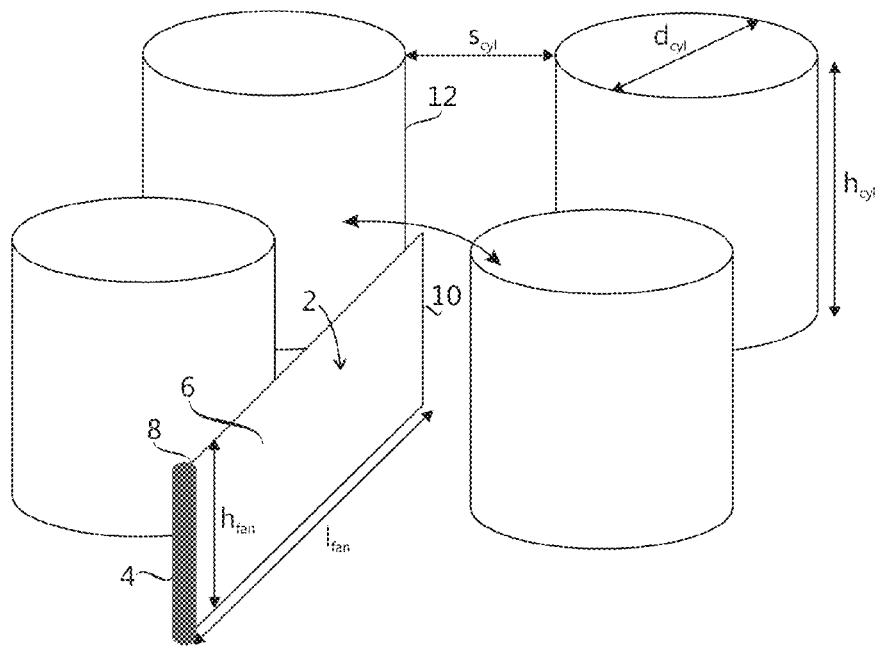
FIG. 1 shows a cooled electrical assembly according to an exemplary embodiment disclosed herein.

FIG. 1 shows an exemplary cooled electrical assembly having a plurality of cooled components and a first cooling fan 2 adapted to provide a cooling flow for cooling the cooled components. The first cooling fan 2 can include a blade holder 4 and a fan blade 6, the fan blade 6 having a fixed end 8 stationary mounted to the blade holder 4 and a free end 10 adapted to swing for generating the cooling flow. Means for swinging the free end 10 are not depicted. The plurality of cooled components includes, for example, four substantially cylindrical components 12 each having a centre axis, the four substantially cylindrical components 12 being spaced apart and located such that the centre axis of each said substantially cylindrical component 12 passes through a respective vertex of a quadrilateral. The free end 10 of the fan blade 6 is located between the four substantially cylindrical components 12.

The four substantially cylindrical components 12 and the first cooling fan 2 are mounted on a circuit board which is not depicted. In an alternative embodiment substantially cylindrical components and a first cooling fan can be mounted on some other substantially planar surface.

Each substantially cylindrical component 12 has the same diameter and height. The four substantially cylindrical components 12 are located at vertices of a square such that a centre axis of each substantially cylindrical component 12 and a respective vertex of the square coincide. The centre axis of each substantially cylindrical component 12 is substantially parallel to a surface normal of the square. In alternative exemplary embodiments four substantially cylindrical components can have different diameters and heights. Further, the four substantially cylindrical components can be located at vertices of a quadrilateral such that position tolerance between a centre axis of a substantially cylindrical component and a respective vertex of a square is no greater than, for example, $0.5 \cdot d_{cyl}$, where $d_{cyl}$ is a diameter of a substantially cylindrical component having the largest diameter.

A distance $s_{cyl}$ between adjacent substantially cylindrical components 12 is, for example, slightly over half of a diameter of substantially cylindrical components 12. In an alternative embodiment four substantially cylindrical components are spaced apart such that a distance between adjacent substantially cylindrical components is in the range of, for example, $0.1 \cdot d_{cyl}$ to $2 \cdot d_{cyl}$, where $d_{cyl}$ is a diameter of a substantially cylindrical component having the largest diameter. A diameter of a substantially cylindrical component can be in the range of, for example, 20 to 50 mm, and a height of a substantially cylindrical component can be in the range of, for example, 20 to 100 mm.

A displacement of the free end 10 of the fan blade 6 is, for example, approximately $0.5 \cdot d_{cyl}$ (e.g., ±10%), the displacement being a distance between the two extreme positions of the free end 10 of the fan blade 6 during oscillation. In alternative embodiments the displacement can be larger. Also, in some embodiments the displacement can be smaller than $0.5 \cdot d_{cyl}$, as long as it is at least $0.25 \cdot d_{cyl}$. The free end of the fan blade should not touch the substantially cylindrical components during oscillation.

When the fan blade 6 is at its rest position the free end 10 of the fan blade 6 is located at a midpoint of the square. Herein a rest position refers to a position of fan blade corresponding to a situation where no force is exerted on the fan blade. In alternative embodiments the free end of the fan blade can be located at a distance from a midpoint of the quadrilateral. In the embodiments where the free end of the fan blade is located at a distance from a midpoint of the quadrilateral the fan blade can be located such that when the fan blade is at its rest position a straight line that coincides with a centre line of the fan blade passes substantially through the midpoint of the quadrilateral. Depending on the embodiment the fan blade can be a long fan blade extending pass the midpoint of the quadrilateral, or the fan blade can be a short fan blade such that only an imaginary extension of the fan blade passes through the midpoint of the quadrilateral.

In an alternative exemplary embodiment, the fan blade is located such that when the fan blade is at its rest position a distance $s_{mdfe}$ between a midpoint of the quadrilateral and the free end of the fan blade complies with inequality:

$$s_{mdfe} \leq 0.5 \cdot s_{cyl} + 0.5 \cdot d_{cyl}.$$

Figure 2:
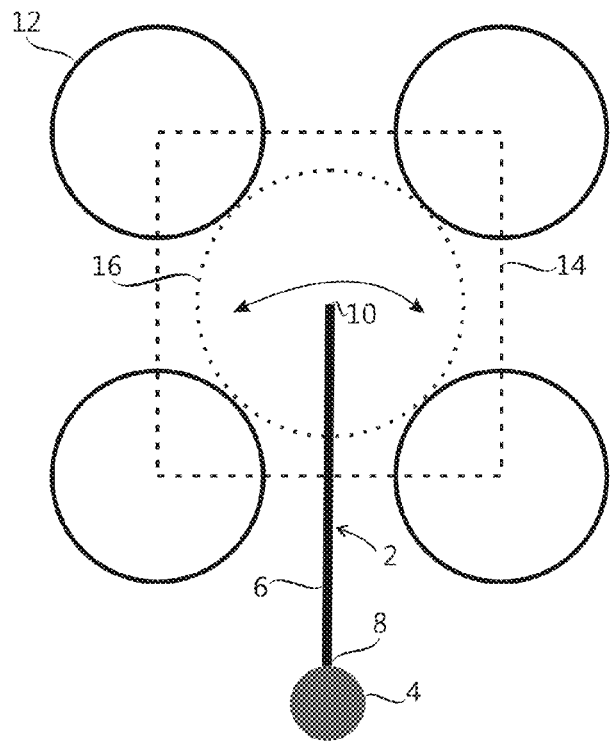
FIG. 2 shows the exemplary embodiment cooled electrical assembly of FIG. 1 directly from above.

In another alternative embodiment the fan blade is located such that when the fan blade is at its rest position the free end of the fan blade is within an inner circle whose centre coincides with the midpoint of the quadrilateral, a circumference of the inner circle touching the outer surface of the closest one of the four substantially cylindrical components. In exemplary embodiments, the free end of the fan blade is located inside a quadrilateral defined by centre axes of four substantially cylindrical components. In FIG. 2, which shows the cooled electrical assembly of FIG. 1 directly from above, a quadrilateral defined by centre axes of four substantially cylindrical components 12 is denoted with a reference number 14 and aforementioned inner circle is denoted with a reference number 16.

A length $l_{fan}$ of the fan blade 6 is, for example, approximately $1.7 \cdot d_{cyl}$ and height $h_{fan}$ of the fan blade 6 is, for example, approximately $0.6 \cdot h_{cyl}$, where $h_{cyl}$ is a height of a substantially cylindrical component 12. In alternative embodiments a length of the fan blade can be equal to or greater than, for example, $0.9 \cdot d_{cyl}$, where $d_{cyl}$ is a diameter of a substantially cylindrical component having the largest diameter, and a height of the fan blade can equal to or greater than, for example, $0.3 \cdot h_{cyl}$, where $h_{cyl}$ is a height of a substantially cylindrical component having the largest height. In some embodiments where all four substantially cylindrical components have a same height a fan blade can be dimensioned such that its height is substantially equal to the height of the substantially cylindrical components, wherein the height of fan blade is 0.9 to 1.1 times the height of the substantially cylindrical components.

The cooled electrical assembly is adapted to vibrate the fan blade 6 at a frequency of a line voltage to which the cooled electrical assembly is connected. In alternative embodiments cooled electrical assembly can be adapted to vibrate the fan blade at a higher frequency, for example at a frequency exceeding 100 Hz.

In an exemplary embodiment the cooled electrical assembly is adapted to vibrate the fan blade such that in its extreme position relative to the rest position the free end of the fan blade is located at a substantially equal distance from the centre axes of the two substantially cylindrical components adjacent the free end at said extreme position. This means that when the fan blade is fully deflected to the right the fan blade is located at a substantially equal distance from the centre axes of the two substantially cylindrical components on the right side of the fan blade. Similarly, when the fan blade is fully deflected to the left the fan blade is located at a substantially equal distance from the centre axes of the two substantially cylindrical components on the left side of the fan blade. The directions left and right relate to a situation where the fan blade extends in vertical direction in its rest position like in FIG. 2.

Figure 3:
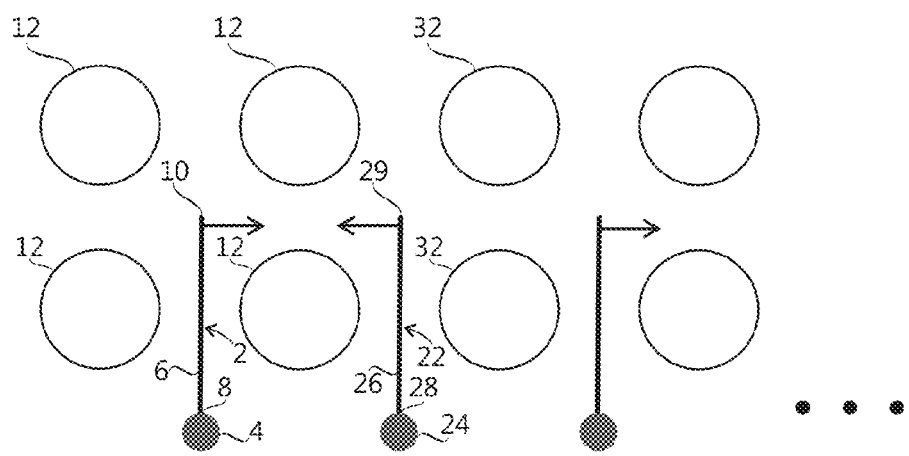
FIG. 3 shows a cooled electrical assembly according to another exemplary embodiment disclosed herein.

A cooled electrical assembly as disclosed herein can include more than four substantially cylindrical components as the plurality of cooled components. FIG. 3 shows an exemplary embodiment where the plurality of cooled components includes two additional substantially cylindrical components 32 located adjacent four substantially cylindrical components 12. The cooled electrical assembly further includes a second cooling fan 22 adapted to provide a second cooling flow for cooling the two additional substantially cylindrical components 32.

The second cooling fan 22 includes a blade holder 24 and a fan blade 26, the fan blade 26 having a fixed end 28 stationary mounted to the blade holder 24 and a free end 29 adapted to swing for generating the second cooling flow for cooling the two additional substantially cylindrical components 32. The second cooling fan 22 is adapted to operate with a phase lag of, for example, 180° relative to the first cooling fan 2, which means that when the free end 10 of the fan blade 6 is moving to the right the free end 29 of the fan blade 26 is moving to the left.

Centre lines of fan blades of the first cooling fan 2 and the second cooling fan 22 are substantially parallel at their rest position. A first line passing through a fixed end 8 of the fan blade 6 and a fixed end 28 of the fan blade 26 is parallel with a second line passing through a free end 10 of the fan blade 6 and a free end 29 of the fan blade 26 while fan blades are in their rest positions. Further, centre axes of substantially cylindrical components on upper row are located at an upper line, and centre axes of substantially cylindrical components on lower row are located at a lower line, the upper line and the lower line being parallel.

A number of substantially cylindrical components in a cooled electrical assembly can be expressed with an equation:

$$n_{scc} = 4 + N_{add} \cdot 2,$$

where $N_{add}$ is a natural number, the set of natural numbers including zero. A number of cooling fans can be expressed with an equation:

$$n_{cf} = \frac{n_{scc} - 2}{2}.$$

In the exemplary embodiment depicted in FIG. 3 there are eight substantially cylindrical components and three oscillating cooling fans.

The first cooling fan and the second cooling fan of the cooled electrical assembly can each be a piezoelectric fan. It is also possible to use a different type of cooling fan as long as the alternative cooling fan has a fan blade provided with a reciprocating free end.

In the cooled electrical assembly, the four substantially cylindrical components can include capacitors such as electrolytic capacitors. However it is clear that the cooled components can also comprise other type of substantially cylindrical components.

A cooled electrical assembly as disclosed herein can utilize air or other gas as a cooling fluid. In some embodiments it is also possible to use a liquid cooling fluid.

Those skilled in the art will appreciate that the inventive concepts disclosed herein can be implemented in various ways. The invention and its embodiments are not limited to the examples described above but may vary within the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A cooled electrical assembly, comprising:
   a plurality of cooled components; and
   a first cooling fan for providing a cooling flow for cooling the cooled components, the first cooling fan including a first blade holder and a first fan blade, the first fan blade having a fixed end stationary mounted to the first blade holder and a free end adapted to swing for generating the cooling flow, wherein the plurality of cooled components includes four substantially cylindrical components each having a centre axis, the four substantially cylindrical components being spaced apart and located such that the centre axis of each said substantially cylindrical component passes through a respective vertex of a quadrilateral, the free end of the first fan blade being located between the four substantially cylindrical components and inside the quadrilateral,
   wherein each of the four substantially cylindrical components and the first cooling fan are electrically powered.

2. A cooled electrical assembly according to claim 1, wherein the four substantially cylindrical components are spaced apart such that a distance between adjacent substantially cylindrical components of the four substantially cylindrical components is in a range of 0.1dcyl to 2dcyl, where dcyl is a diameter of a substantially cylindrical component of the four substantially cylindrical components having a largest diameter.

3. A cooled electrical assembly according to claim 2, wherein the centre axis of each of said four substantially cylindrical components is substantially parallel to a surface normal of the quadrilateral.

4. A cooled electrical assembly according to claim 3, wherein the quadrilateral is a square, and
   wherein the four substantially cylindrical components are located at vertices of the square such that position tolerance between the centre axis of a substantially cylindrical component of the four substantially cylindrical components and a respective vertex of the square is no greater than 0.5dcyl.

5. A cooled electrical assembly as claimed in claim 1, wherein a displacement of the free end of the first fan blade is at least 0.25dcyl, where dcyl is a diameter of a substantially cylindrical component of the four substantially cylindrical components having a largest diameter, the displacement being a distance between two extreme positions of the free end of the first fan blade during oscillation.

6. A cooled electrical assembly as claimed in claim 1, wherein the first fan blade is located such that when the first fan blade is at its rest position a distance smdfe between a midpoint of the quadrilateral and the free end of the first fan blade complies with an inequality:

$$smdfe \leq 0.5\, S_{cyl} + 0.5\, d_{cyl}.$$

7. A cooled electrical assembly as claimed in claim 1, wherein the first fan blade is located such that when the first fan blade is at its rest position, a straight line that coincides with a centre line of the first fan blade passes substantially through a midpoint of the quadrilateral.

8. A cooled electrical assembly as claimed in claim 1, wherein the first fan blade is located such that when the first fan blade is at its rest position, the free end of the first fan blade is within an inner circle whose centre coincides with a midpoint of the quadrilateral, a circumference of the inner circle touching an outer surface of a closest one of the four substantially cylindrical components.

9. A cooled electrical assembly as claimed in claim 1, wherein a length of the first fan blade is equal to or greater than 0.9dcyl, where dcyl is a diameter of a substantially cylindrical component of the four substantially cylindrical components having a largest diameter, and a height of the first fan blade is equal to or greater than 0.3hcyl, where hcyl is a height of a substantially cylindrical component of the four substantially cylindrical components having a largest height.

10. A cooled electrical assembly as claimed in claim 1, wherein the cooled electrical assembly is configured to vibrate the first fan blade at a frequency of a line voltage to which the cooled electrical assembly is connected.

11. A cooled electrical assembly as claimed in claim 1, wherein each of the four substantially cylindrical components has substantially a same diameter and a same height.

12. A cooled electrical assembly as claimed in claim 1, wherein the cooled electrical assembly is configured to vibrate the first fan blade such that in an extreme position relative to a rest position, the free end of the first fan blade is located at a substantially equal distance from centre axes of two substantially cylindrical components of the four substantially cylindrical components adjacent the free end of the first fan blade at said extreme position.

13. A cooled electrical assembly as claimed in claim 1, wherein the first cooling fan is a piezoelectric fan.

14. A cooled electrical assembly as claimed in claim 1, wherein the plurality of cooled components comprises:
   two additional substantially cylindrical components located adjacent the four substantially cylindrical components, and the cooled electrical assembly includes a second cooling fan for providing a second cooling flow for cooling the two additional substantially cylindrical components, the second cooling fan having a second blade holder and a second fan blade, the second fan blade having a fixed end stationary mounted to the second blade holder and a free end configured to swing for generating the second cooling flow, the second cooling fan being configured to operate with a phase lag of 180° relative to the first cooling fan, a centre line of the first fan blade and a centre line of the second fan blade being substantially parallel at their rest position.

* * * * *